United States Patent
Geisler et al.

(10) Patent No.: US 10,021,816 B2
(45) Date of Patent: Jul. 10, 2018

(54) POWER CONVERTER ARRANGEMENT AND METHOD FOR PRODUCING A POWER CONVERTER ARRANGEMENT

(71) Applicant: Siemens Aktiengesellschaft, Munich (DE)

(72) Inventors: Stephan Geisler, Weissbach (DE); Wolfgang Jarausch, Chemnitz (DE); Michael Kaspar, Putzbrunn (DE); Stefan Kiefl, Munich (DE); Kai Kriegel, Munich (DE); Matthias Neumeister, Nuremberg (DE); Julian Seidel, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 158 days.

(21) Appl. No.: 14/888,746

(22) PCT Filed: May 5, 2014

(86) PCT No.: PCT/EP2014/059037
§ 371 (c)(1),
(2) Date: Nov. 3, 2015

(87) PCT Pub. No.: WO2014/184020
PCT Pub. Date: Nov. 20, 2014

(65) Prior Publication Data
US 2016/0088778 A1   Mar. 24, 2016

(30) Foreign Application Priority Data
May 15, 2013   (EP) .................................... 13167816

(51) Int. Cl.
*H05K 7/20*   (2006.01)
*H02M 7/00*   (2006.01)

(52) U.S. Cl.
CPC ........ *H05K 7/20927* (2013.01); *H02M 7/003* (2013.01)

(58) Field of Classification Search
CPC ...... H02M 1/44; H02M 7/537; H05K 7/1432; H05K 1/0203; H05K 2201/1053;
(Continued)

(56) References Cited

U.S. PATENT DOCUMENTS 4,513,064 A * 4/1985 Marcus .................. H05K 3/366
361/803
5,875,205 A * 2/1999 Spaeth ................ H01S 5/02284
257/82
(Continued)

FOREIGN PATENT DOCUMENTS

| CN | 1820559 A | 8/2006 | ............. H02M 7/00 |
| CN | 101465595 A | 6/2009 | ............. H02M 1/00 |

(Continued)

OTHER PUBLICATIONS

European Search Report, Application No. 13167816.1, 6 pages, dated Sep. 25, 2013.
(Continued)

*Primary Examiner* — James Wu
*Assistant Examiner* — Michael Matey
(74) *Attorney, Agent, or Firm* — Slayden Grubert Beard PLLC (57) ABSTRACT

A three-dimensional arrangement for a power converter device, e.g., an inverter or a rectifier, is provided. The switching elements, activation electronics, the load connections of the power converter device are arranged on a carrier device in such a way that defines especially short conduction paths. The components of the power converter device (e.g., all required components), such as switching elements, control electronics, and load connections, are arranged on a (Continued)

common carrier device. The carrier device is simultaneously used as a cooling device for the entire switching device. The power converter device may thereby achieve particularly efficient performance.

16 Claims, 5 Drawing Sheets

(58) Field of Classification Search
CPC .. H05K 7/02; H05K 7/2089; H05K 2201/042; H05K 2201/044; H05K 2201/056; H05K 2201/0715; H05K 2201/09018; H05K 3/368; G06F 1/18
See application file for complete search history.

(56) References Cited

U.S. PATENT DOCUMENTS

| | | | | |
|---|---|---|---|---|
| 6,002,183 | A * | 12/1999 | Iversen | H01L 23/467 |
| | | | | 257/691 |
| 6,160,326 | A * | 12/2000 | Iversen | H01L 23/467 |
| | | | | 257/107 |
| 6,501,653 | B1 * | 12/2002 | Landsgestell | H02M 7/003 |
| | | | | 165/185 |
| 6,778,389 | B1 * | 8/2004 | Glovatsky | H01L 25/065 |
| | | | | 165/80.1 |
| 7,180,736 | B2 * | 2/2007 | Glovatsky | H05K 7/20163 |
| | | | | 361/688 |
| 9,644,471 | B2 * | 5/2017 | Logan | E21B 47/01 |
| 9,807,914 | B2 * | 10/2017 | Liu | H05K 7/20927 |
| 2006/0291261 | A1 | 12/2006 | Ohnishi et al. | 363/141 |
| 2007/0284157 | A1 * | 12/2007 | Heller | H02K 7/006 |
| | | | | 180/54.1 |
| 2009/0154101 | A1 | 6/2009 | Korich et al. | 361/699 |
| 2010/0327709 | A1 * | 12/2010 | Minato | H05K 1/18 |
| | | | | 310/68 D |
| 2011/0303929 | A1 * | 12/2011 | Strickler | H01L 25/0753 |
| | | | | 257/91 |
| 2013/0044434 | A1 | 2/2013 | Sharaf et al. | 361/702 |
| 2013/0320896 | A1 * | 12/2013 | Sevakivi | H05K 7/2089 |
| | | | | 318/400.26 |
| 2014/0252400 | A1 * | 9/2014 | Chen | F21V 29/20 |
| | | | | 257/99 |
| 2015/0285256 | A1 * | 10/2015 | Nakagami | H05K 7/209 |
| | | | | 417/45 |

FOREIGN PATENT DOCUMENTS

| | | | |
|---|---|---|---|
| CN | 102957328 A | 3/2013 | H02M 7/00 |
| WO | 2014/184020 A1 | 11/2014 | H02K 11/00 |

OTHER PUBLICATIONS

International Search Report and Written Opinion, Application No. PCT/EP2014/059037, 12 pages, dated Aug. 8, 2014.
Chinese Office Action, Application No. 201480028350.7, 6 pages, dated Apr. 1, 2017.

* cited by examiner

POWER CONVERTER ARRANGEMENT AND METHOD FOR PRODUCING A POWER CONVERTER ARRANGEMENT

CROSS-REFERENCE TO RELATED APPLICATIONS

This application is a U.S. National Stage Application of International Application No. PCT/EP2014/059037 filed May 5, 2014, which designates the United States of America, and claims priority to EP Application No. 13167816.1 filed May 15, 2013, the contents of which are hereby incorporated by reference in their entirety.

TECHNICAL FIELD

The present invention relates to a power converter arrangement and a method for producing a power converter arrangement.

BACKGROUND

Power converter arrangements are electrical circuit arrangements for the conversion of a direct electric current voltage (D.C.) into an alternating current voltage (A.C.) (inverters) and/or for the conversion of an A.C. voltage into a D.C. voltage (rectifiers). Inverters are used, for example, in the field of regenerative energy sources, in order to permit the infeed of a D.C. voltage generated by a photovoltaic installation or similar into an A.C. system. Inverters of this type are also required, for example, for battery-powered standby power supply systems, in which the D.C. voltage delivered by the battery is converted into an A.C. voltage, which can then be fed into the standby grid system. In addition, rectifiers are applied, for example, for the charging of a battery or a battery arrangement which is supplied by an A.C. voltage source. In addition, combinations of rectifiers and inverters are specifically used in electric vehicles. During traveling, for example, a D.C. voltage delivered by a battery is converted into a controlled A.C. voltage, which powers a vehicle drive system. During braking, the electrical drive system then acts as a generator and generates an A.C. voltage which, further to rectification in a power converter circuit, can be used to charge the battery.

In existing power converters, power modules are used which employ a planar arrangement of power semiconductor chips on a substrate, generally of a ceramic material. Accordingly, the printed conductors for the connection of said semiconductor chips are, by definition, also configured in a planar arrangement. Accordingly, the arrangement of printed conductors is restricted to two dimensions. This two-dimensional arrangement is associated, in some cases, with relatively long current paths. Moreover, in some cases, the supply and return conductors surround relatively large surface areas. These two effects are associated with an in-service increase in the stray inductance of a power converter arrangement of this type. This has a negative impact upon the switching performance of the power semiconductors. In these cases, the power semiconductors used, for example diodes or IGBTs (Insulated Gate Bipolar Transistors), have higher switching losses, and heat up significantly as a result. In this case, the cooling circuit will therefore need to be dimensioned to a corresponding magnitude. The capacity of a power converter of this type is therefore less dependent upon the semiconductor chips used than upon the cooling facilities available. The more effective the cooling of the power converter, the higher the capacity available.

SUMMARY

One embodiment provides a power converter arrangement, including a three-dimensional carrier arrangement which has a trapezoidal cross section perpendicular to one spatial direction; and a plurality of switching elements, wherein the plurality of switching elements is arranged on two opposing sides of the carrier arrangement.

In a further embodiment, each of the plurality of switching elements comprises a semiconductor switch and/or a diode.

In a further embodiment, the plurality of switching elements is arranged on the external sides of the carrier arrangement.

In a further embodiment, the carrier arrangement is provided with a hollow interior.

In a further embodiment, a coolant fluid flows through the interior of the carrier arrangement.

In a further embodiment, the switching elements are arranged on an upper surface of a substrate, and an underside, opposite said upper surface of the substrate is arranged on a cooling element.

In a further embodiment, the power converter arrangement also includes a control device which is designed for the control of the plurality of switching elements and is arranged on one further side of the carrier arrangement, wherein the further side of the carrier arrangement connects both sides of the carrier arrangement with the plurality of switching elements.

In a further embodiment, the power converter arrangement also includes a connection device which is designed for the provision of D.C. and/or A.C. voltage connections and is arranged on one side of the carrier arrangement, which connects both sides of the carrier arrangement with the plurality of switching elements.

In a further embodiment, the power converter arrangement also includes a capacitor arrangement which is connected to the connection device.

In a further embodiment, the plurality of switching elements is bonded to the control device and/or to the connection device by means of spring contacts.

Another embodiment provides a method for the production of a power converter arrangement, comprising steps for providing a three-dimensional carrier arrangement, which has a trapezoidal cross section perpendicular to one spatial direction; and arranging a plurality of switching elements on the carrier arrangement, wherein the plurality of switching elements is arranged on two opposing sides of the carrier arrangement.

BRIEF DESCRIPTION OF THE DRAWINGS

Example embodiments of the present invention are discussed below with reference to the attached drawings, in which.

DETAILED DESCRIPTION

Embodiments of the present invention provide an efficiently coolable circuit arrangement with an improved switching performance.

Some embodiments provide a power converter arrangement with a three-dimensional carrier arrangement which has a trapezoidal cross section perpendicular to one spatial direction; and a plurality of switching elements, wherein the plurality of switching elements is arranged on two opposing sides of the carrier arrangement.

Other embodiments provide a method for the production of a power converter arrangement, comprising steps for the provision of a three-dimensional carrier arrangement which was a trapezoidal cross section perpendicular to one spatial direction; and the arrangement of a plurality of switching elements on the carrier arrangement, wherein the plurality of switching elements is arranged on two opposing sides of the carrier arrangement.

An idea underlying some embodiments is that all the requisite structural elements of a power converter arrangement should be arranged on a three-dimensional carrier, such that the efficient exploitation of all the external sides of said carrier is achieved. In conventional two-dimensional arrangements, only an upper side and an underside of the two-dimensional carrier are available for accommodation purposes. Given that, under normal circumstances, for the purposes of the requisite cooling, a cooling element must be fitted to one of these two sides, only one side of conventional power converter arrangements is available for the accommodation of components. Conversely, as a result of the three-dimensional configuration of the carrier, a plurality of external sides is available, all of which can be used to accommodate components of the power converter arrangement.

This three-dimensional power converter arrangement has a significant advantage, in that a carrier arrangement according to the invention also serves as a cooling element. Accordingly, the efficient cooling of the switching elements, the requisite control electronics and the power feeds can be achieved.

A further advantage is provided in that, in the three-dimensional arrangement according to the invention, the spatial clearance between the control electronics and the power electronics connections is very small. Accordingly, very short conduction paths between the control electronics and the power electronics can be achieved. This results in correspondingly small conductor inductances, which impacts positively upon the switching performance and the resulting switching losses in the power converter arrangement.

It is also advantageous that power-carrying connections in the power converter arrangement can also be configured with very short current paths. Specifically, the three-dimensional configuration of the power converter arrangement permits a requisite intermediate circuit capacitor to be guided very close up to the semiconductor switching elements.

According to one embodiment, each of the plurality of switching elements comprises a semiconductor switch and/or a diode. Semiconductor switches including, for example IGBTs or MOSFETS, specifically in combination with diodes, have proven to be effective in power converter arrangements of this type.

According to a further embodiment, the plurality of switching elements is arranged on the external sides of the carrier arrangement. The switching elements therefore face outwards from the carrier arrangement. Accordingly, no further protective measures, such as the additional isolation of the switching elements, are required.

According to a further embodiment, the carrier arrangement is provided with a hollow interior, and a coolant fluid preferably flows through the interior of the carrier arrangement. In a carrier arrangement thus configured, specifically a fluid-cooled carrier arrangement, a particularly efficient cooling of the power converter arrangement is possible. This also results in a particularly efficient power converter arrangement.

According to a further embodiment, the switching elements are arranged on an upper surface of a substrate, wherein the underside of the substrate, opposite said upper surface of the substrate, is arranged on a cooling element. In this way, the particularly efficient dissipation of the thermal energy of the switching elements to the carrier arrangement is possible, for the purposes of cooling.

In a further embodiment, the power converter arrangement also comprises a control device, which is designed for the control of the plurality of switching elements, wherein the control device is arranged on one further side of the carrier arrangement, and the further side of the carrier arrangement connects both sides of the carrier arrangement with the plurality of switching elements. By the arrangement of the control device between the switching elements, a connection of the control device to the switching elements can be achieved by means of particularly short and low-inductance conduction paths. This has a highly favorable impact upon the switching performance and the resulting switching losses associated with the power converter arrangement.

In a further embodiment, the power converter arrangement also comprises a connection device, which is designed for the provision of D.C. and/or A.C. voltage connections, wherein the connection device is arranged on one side of the carrier arrangement, which connects both sides of the carrier arrangement with the plurality of switching elements. Preferably, this side fitted with the connection device is arranged opposite the side fitted with the control device. In this way, the power connections of the power converter arrangement can also be configured with a particularly short length.

In a further embodiment, the power converter arrangement also comprises a capacitor arrangement, which is connected to the connection device. In this way, the capacitor arrangement, for example an intermediate circuit capacitor in a power converter arrangement, can be guided very close up to the switching elements. This has an advantageous impact upon the switching performance of the power converter arrangement.

According to a specific embodiment, the plurality of switching elements is connected to the control device and/or the power converter device by means of spring contacts. The use of spring contacts for the connection of the control device or the connection device permits a particularly straightforward and rapid contact bonding of the individual components.

Figure 1:
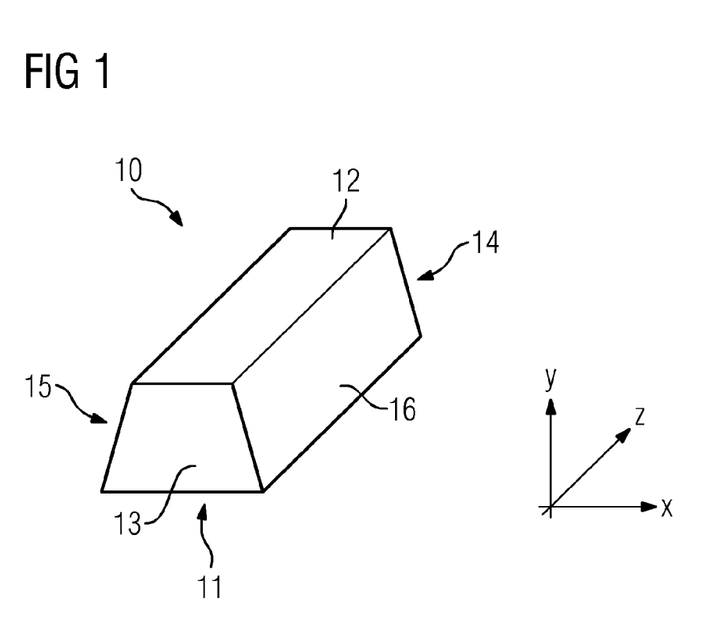
FIG. 1 shows an oblique perspective view of a carrier arrangement according to one embodiment of the present invention.

FIG. 1 shows an oblique view of a carrier device 10 for a power converter device according to the invention. The external form of said carrier device 10 is approximately equivalent to a prism with parallel upper and undersides, lying in the x-z plane. The upper side 12 and the lower side 11 are preferably configured in the form of a rectangle. To this end, the edges which run parallel to the z-axis are preferably of equal length, whereas the outer edges, which run parallel to the x-axis, are preferably shorter on the upper side 12 than on the lower side 11. Accordingly, the front side 13 and the rear side 14 of the carrier device 10 are configured in the form of an equal-sided trapezium. The front side 13 and the rear side 14 are preferably arranged in parallel to the x-y-plane. However, it is also conceivable that the front side 13 and the rear side 14 are at least slightly inclined in relation to said x-y-plane. Finally, the carrier device 10 is also provided with two lateral surfaces 15 and 16, which respectively connect the lower side 11 to the upper side 12.

The carrier device 10 is preferably provided with a hollow interior. In this way, a coolant fluid can flow through the interior of the carrier device 10. Accordingly, this permits the efficient cooling of the power converter device. Alternatively, it is also conceivable that the carrier device 10 has one or more interior cooling ducts, through which a coolant fluid can flow for the cooling of the power converter arrangement. Said cooling ducts may be configured, for example, with a meandering or labyrinthine structure. The use of a coolant fluid for cooling purposes ensures exceptionally efficient cooling. However, it is also conceivable in addition that the interior of the carrier device 10 can be cooled by a gas, for example air or similar.

The external sides of the carrier device 10, specifically the lower side 11, the upper side 12 and the two lateral surfaces 15 and 16 are preferably configured as closed surfaces such that, on said sides, no escape of coolant fluid is possible. However, the outer surfaces may also be provided with corresponding openings (not represented), by means of which cooling ribs on the components fitted to the carrier arrangement 10 can penetrate the interior of the carrier device. By this arrangement, the particularly effective cooling of the cooling ribs can be achieved. In this case, however, attention must be paid to providing a leak-tight seal on the openings during operation.

On the front side 13 and/or the rear side 14, openings may also be provided for the inlet/outlet of a coolant fluid (not represented). However, according to requirements, said openings for the inlet/outlet of the coolant fluid may also be arranged on another side of the carrier device 10. The carrier device 10 may also be provided with an appropriate attachment device (not represented) which permits the attachment of the further components of the power converter device to the carrier device 10 and, where applicable, also permits the appropriate electrical contact bonding of the individual components.

Figure 2:
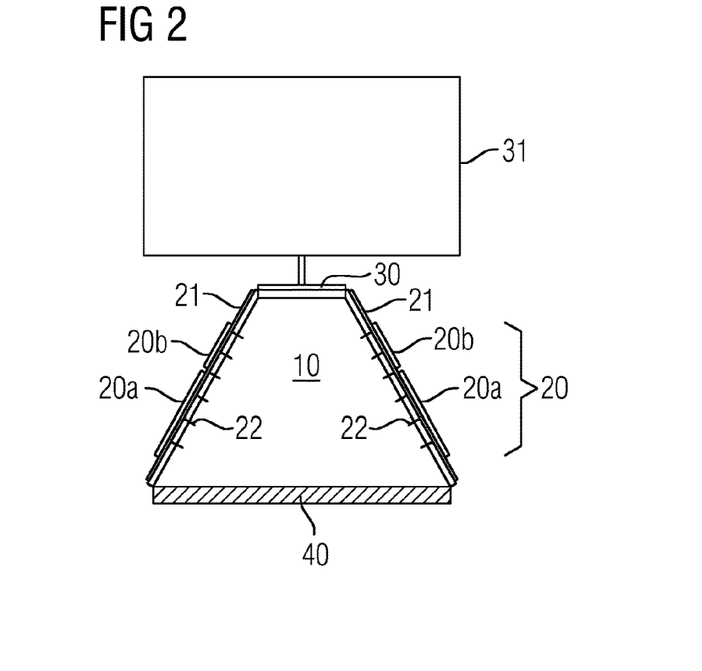
FIG. 2 shows a schematic cross sectional representation of a carrier arrangement according to a further embodiment of the present invention.

FIG. 2 shows a cross section of a carrier device 10 in the x-y-plane, perpendicularly to the z-axis. In this section of the x-y-plane, the carrier device 10 has a trapezoidal cross section. The lower side 11 and the upper side 12 form the two parallel sides of the trapezium in this case, whereas the legs of the trapezium are formed by the two lateral surfaces 15 and 16. The trapezium is preferably equal-sided, i.e. the two legs of the trapezium are of equal length. A carrier device 10 with a trapezoidal cross section of this type is particularly advantageous for the arrangement of the components of the power converter device. In principle, however, it is also conceivable that the device 10 has a cross section which differs from an equal-sided trapezium.

One or more switching elements 20 are arranged on each of the two lateral surfaces 15 or 16 in FIG. 2, which correspond to the two legs of the trapezium. Preferably, such switching elements 20 are arranged on both external sides 15 and 16 of the carrier device 10. An exceptionally uniform thermal distribution during the operation of the power converter arrangement is achieved accordingly. Although an equally symmetrical distribution of the switching elements 20 on the two external sides 15 and 16 of the carrier arrangement permits an exceptionally uniform and advantageous distribution, it is also conceivable, for specific applications, that the switching elements 20 should be arranged on only one of the two external sides 15 and 16, or that more switching elements 20 should be arranged on one of the two external sides 15 and 16 than on the opposite lateral surface.

Each of the switching elements 20 is preferably provided with a semiconductor switching element 20a and with a diode 20b. The semiconductor switching element 20a is preferably an insulated gate bipolar transistor (IGBT) or a MOSFET. However, other types of switching elements, specifically semiconductor elements, are also possible. The additionally-provided diode 20b preferably operates as a free-wheeling diode.

The switching elements 20 are preferably arranged in this case on a carrier substrate 21 which, in addition to the semiconductor switching elements 20a and the diodes 20b, also has corresponding printed conductors for the connection of the components. Preferably, the substrate 21 carrying the switching elements 20 is arranged in this case on the carrier device 10 such that the switching elements 20 face outwards from the carrier device. Accordingly, the substrate 21 acts simultaneously as an insulating medium between the switching elements 20 and the carrier device 10. As the switching elements 20 are therefore fitted to the carrier device 10 in an insulating arrangement, no further insulation on the outward-facing side of the carrier device 10 is necessary.

In the interests of a more effective dissipation of thermal energy generated in the switching elements 20 during the operation of the power converter arrangement, the lower side of the substrate 21 may be provided with a cooling element 22. Said cooling element may be configured, for example, as a structure with a large surface area, for example in the form of cooling ribs, which permits particularly effective heat dissipation. To this end, the switching elements 20 provided with the cooling elements 22 are arranged on the carrier device 10 such that the cooling elements 22 project into the interior of the carrier device 10. During operation, accordingly, the cooling element 22 is surrounded and cooled by the flux of the coolant fluid in the interior of the carrier device 10. In this way, a particularly effective dissipation of the thermal energy generated can be achieved, thereby enhancing the efficiency of the power converter arrangement.

For the connection of the switching elements 20, and the connection of the switching elements 20 with the other components of the power converter device, numerous known and, in some cases, innovative connection technologies are possible. For example, the switching elements 20 may be contact-bonded by means of a conventional wire-bond connection method. Alternatively, connection by means of SiPLIT technology (Siemens Planar Interconnect Technology) is also possible. In addition, all other known connection technologies are also possible including, for example, screw connections, contact bonding by means of spring contacts 33, etc.

The lower side 11 of the carrier device 10 is provided with control electronics 40 for the control of the switching elements 20. The control electronics 40 are arranged on the lower side 11 of the carrier device 10 such that, firstly, thermal contact is established between the control electronics 40 and the device 10 and, secondly, the control electronics 40 are electrically isolated from the carrier device 10. In this way, thermal energy from the control electronics 40, which is generated during the operation of the power converter device, can also be dissipated by the carrier device 10. The outer sides of the control electronics 40 are positioned in this case in the immediate vicinity of the outer sides of the switching elements 20. Accordingly, the connection paths between the control electronics 40 and the switching elements 20 are exceptionally short. As a result, only very small conductor inductances are generated. In consequence, in the arrangement according to the invention, the switching elements 20 can be controlled by the control electronics 40 with exceptional precision. The accurate and rapid switching performance also generates reduced switching losses, with a consequent reduction in the thermal loading of the power converter arrangement.

The upper side 12 of the carrier device 10 which lies opposite the lower side 11 of the control device 40 is also provided with a connection device 30 for the contact bonding of the switching elements 20 with the load connections. The function of the connection device 30 is firstly the connection of the A.C. voltage connections, and secondly also the connection of the D.C. voltage connections. To this end, the connection device 30 is preferably configured as a multi-layer busbar, as described in greater detail below.

Said connection device 30 is furthermore also associated with a capacitor device 31. For example, the capacitor device 31 may be comprised of one or more intermediate circuit capacitors, of the type which are customarily used in power converter devices. As a result of the three-dimensional arrangement of components around the carrier device 10, the capacitor device 31 can be guided very close up to the switching elements 20 in this case. Accordingly, only very short conduction paths, with correspondingly small conductor inductances, arise between the capacitor device 31 and the switching elements 20. This also impacts advantageously upon the operation of the power converter device according to the invention.

The connection device 30 is furthermore also arranged on the carrier device 10 such that thermal energy from the connection device 30 can be effectively dissipated by the carrier device 10. As a result of this cooling of the connection device 30, said connection device 30 can also be configured with smaller dimensions, with no resulting increase in the thermal loading of the current-carrying load connections.

Figure 3:
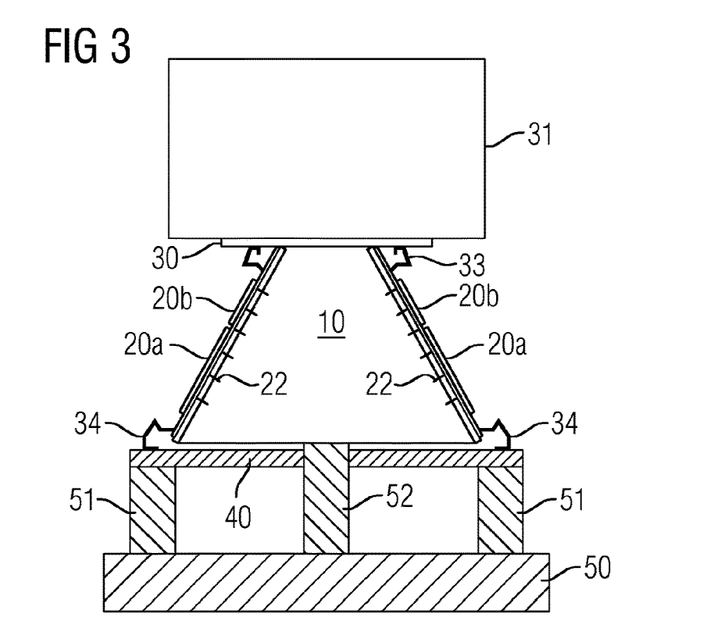
FIG. 3 shows a schematic cross sectional representation of a carrier arrangement according to a further embodiment of the present invention.

FIG. 3 shows a cross sectional view of a carrier device 10 and further components of a power converter arrangement according to the invention. Again in this case, one or more switching elements are arranged respectively on the two outer sides 15 and 16 of the carrier device 10. Here again, a connection device 30 with a capacitor device 31 is arranged on the upper side 12. The control device 40 is arranged on the lower side 11 of the carrier device 10. The control device 40 is secured in place by one or more retaining elements 51. The carrier device 10 is also secured in place by one or more retaining elements 52. The retaining elements 51 for the retention of the control device 40, and the retaining elements 52 for the retention of the carrier device 10, are preferably secured in place by common baseplate 50, for example a housing wall or similar. Accordingly, a space is formed between the retaining elements 51 of the control device and the retaining elements 52 of the carrier device, which is sufficient to accommodate the components of the control device 40.

Figure 4:
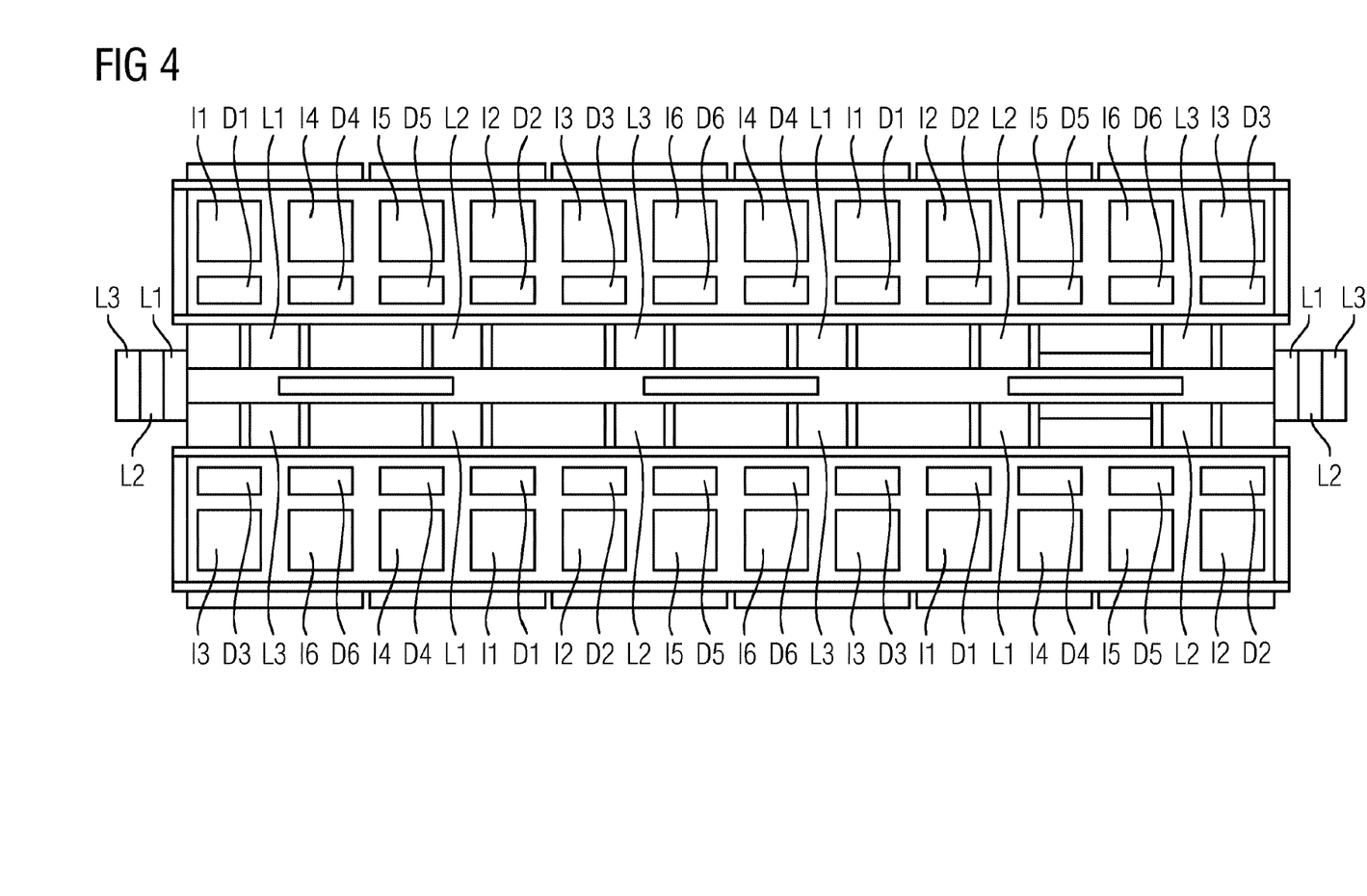
FIG. 4 shows a schematic representation of an overhead view of a power converter arrangement according to a further embodiment of the present invention.

FIG. 4 shows an overhead view of a power converter device according to the invention, representing an overhead view in the x-z-plane. In the representation shown in FIG. 4, a load connection 32 is respectively arranged on the left-hand and/or right-hand outer side, by means of which the connection device 30 may be connected to an external A.C. voltage connection. By means of said load connections 32, the power converter device according to the invention may therefore be connected, for example, to an external A.C. grid system, an A.C. consumer or an A.C. voltage source. To this end, all phase connections for the connection of the A.C. voltage are preferably brought out on both sides respectively. Alternatively, it is also possible that the A.C. connection is brought out on one side only, or that the individual phases are brought out on different sides, In principle, it is also conceivable in addition, where required, that the D.C. voltage connections of the power converter device should also be brought out laterally to the load connections 32. For example, the A.C. voltage connections may be brought out on one side, for example to the left, and the D.C. voltage connections may be brought out on the other side, for example to the right. Other variations for the bringing-out of the load connections are also possible.

Preferably, however, the D.C. voltage connections of the power converter arrangement according to the invention are configured directly on the capacitor device 31, i.e. on the corresponding intermediate circuit capacitors.

As viewed from the top or bottom to the center of the image, the following components are represented in FIG. 4: in the outermost area, i.e. at the very top and the very bottom, the control connections for the switching elements are arranged. The corresponding semiconductor switches I1 to I6 are adjacent thereto. This gives rise to exceptionally short conductor routes for the control of the respective switching elements. Progressing further from the bottom/top towards the center of the image, the corresponding diodes D1 to D6 are next in sequence. These are followed by the contact zones for the contact bonding of the switching elements 20 to the contact zones of the connection device 30. Finally, the connection device 30 is arranged in the central mid-zone. The connection points for the contact bonding of the switching elements to the connection device 30 are arranged such that the conductor paths between the switching elements and the connection points are as short as possible. In consequence, in FIG. 4, the semiconductor switches I1 and I4, together with the diodes D1 and D4, are very close to the connection point for the conductor L1, the semiconductor switches I2 and I5, together with the diodes D2 and D5, are very close to the connection point for the conductor L2, and the semiconductor switches I3 and I6, together with the diodes D3 and D6, are very close to the connection point for the conductor L3. Moreover, in the interests of more uniform thermal loading, the switching elements and connection points for the respective phases of the A.C. voltage are arranged on the two sides of the carrier device 10 in an offset pattern.

In this arrangement, connection between the switching elements 20 and the connection device 30 is effected, for example, by means of conventional bond connection technology, by means of suitable screw connections or, where applicable, by the use of spring elements 33 for contact bonding. In this regard, for example, the abovementioned SiPLIP technology has also proven to be particularly advantageous. Spring elements permit exceptionally straightforward and rapid fitting and contact bonding in this case. However, on the grounds of their limited rather contact surface in the spring contact area, spring elements are preferably appropriate for lower current ratings. The contact bonding of the control connections of the switching elements 20 with the control device 40 proceeds analogously with the corresponding contact elements 34.

Figure 5:
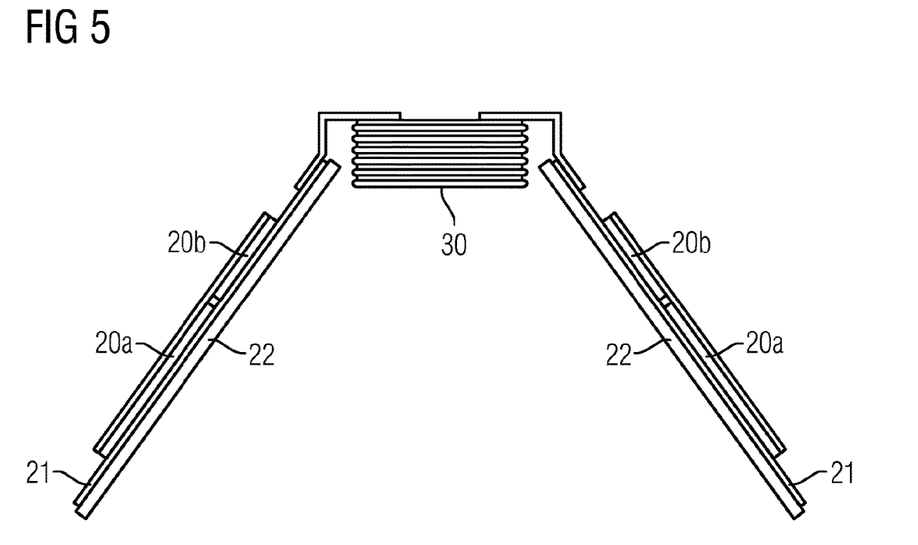
FIG. 5 shows a schematic cross sectional representation of a power converter arrangement according to a further embodiment of the present invention.

FIG. 5 shows a cross section of a connection device 30 and semiconductor elements 20 connected to the connection device 30. To this end, the connection device 30 is configured as a multi-layer busbar. A busbar of this type is comprised of a plurality of current-carrying metal buses which are mutually separated by electrically-insulating spacers. In the example represented, the connection device 30, considered from bottom to top, is firstly comprised of a number of current-carrying layers for the A.C. voltage connections. These layers are respectively separated from one another by an appropriate insulating medium. Current-carrying layers for the D.C. voltage, also separated by insulating media, are arranged immediately above. This arrangement provide an exceptionally compact arrangement of all the requisite power connections. A current-carrying layer which is to be bonded to a connection point with a switching element 20 is routed upwards in this case by an appropriate through-connection arrangement (not represented) and is bonded to the switching elements 20 by means of appropriate contact elements.

The switching elements 20, which are comprised, for example, of semiconductor switching elements 20a and diodes 20b, are arranged on an appropriate insulating carrier material 21. For example, this may be a ceramic carrier material. Said carrier material is configured for the dissipation of heat generated, preferably to a further heat sink 22. In the interests of improved thermal contact, a thermally conductive paste or similar—not represented—may be applied between the substrate 21 and the heat sink 22.

Figures 6, 7:
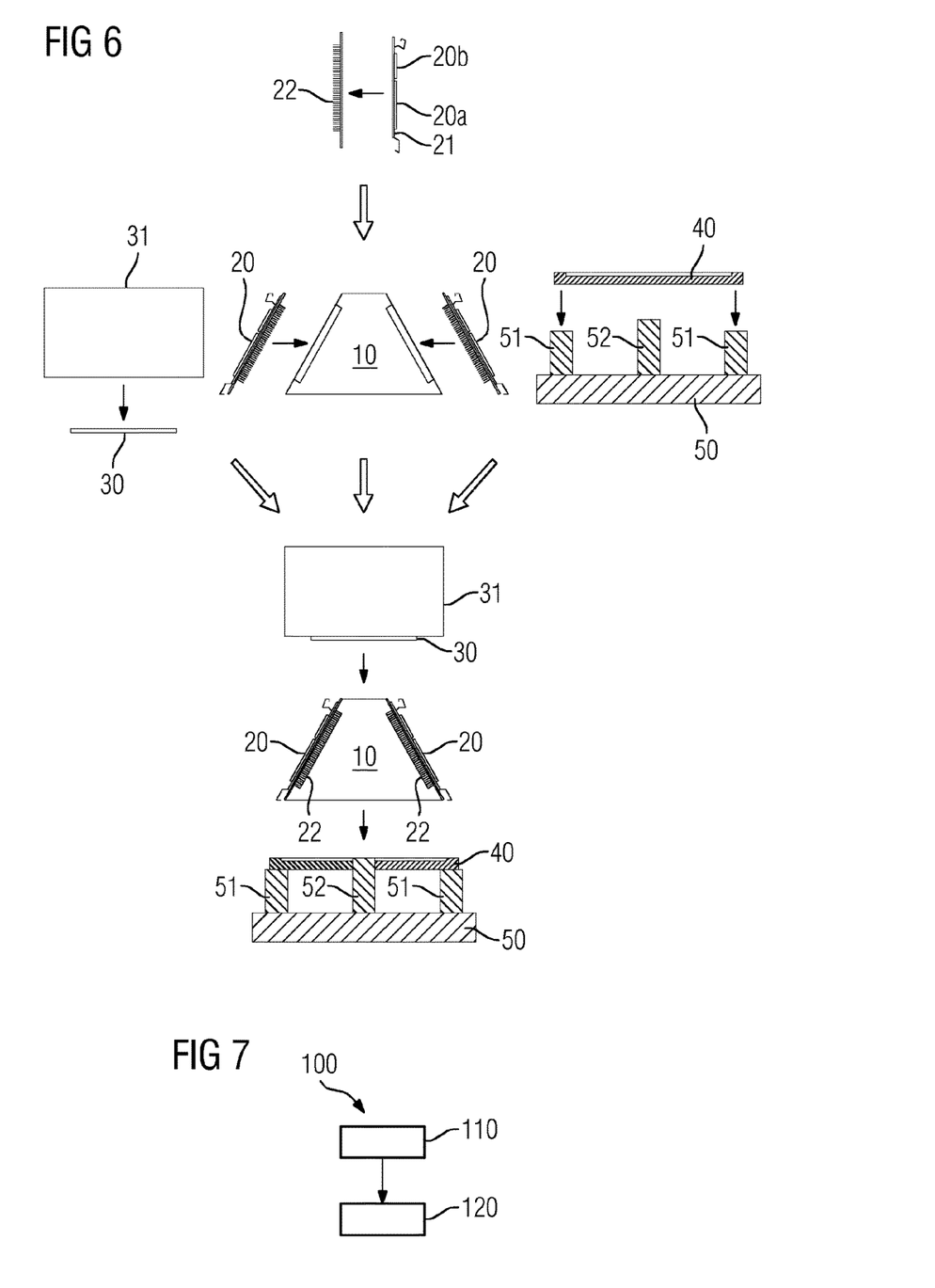
FIG. 6 shows a schematic representation of a manufacturing process for a power converter arrangement, which forms the basis of a further embodiment of the present invention.
FIG. 7 shows a detailed schematic representation of a manufacturing process for a power converter arrangement, which forms the basis of a further embodiment of the present invention.

FIG. 6 shows a schematic representation of a method for the production of a power converter device according to one embodiment of the present invention. To this end, in a first step 110, a three-dimensional carrier device 10 is firstly provided, which has a trapezoidal cross section perpendicular to one spatial direction Z. Thereafter, in step 120, a plurality of switching elements 20 is applied to the carrier arrangement 10, wherein the plurality of switching elements 20 is arranged on two opposing sides 15 and 16 of the carrier arrangement 10.

The production method for a power converter device according to the invention is again represented in detail in FIG. 7. In the upper part of this figure, a switching element 20 comprised of a semiconductor switch 20a and a diode 20b is firstly bonded with a cooling element 22. In the stages represented thereunder, as shown in the central part, the preconfigured switching elements 20 with the cooling elements are arranged on the carrier device 10. To this end, the carrier device 10 is provided, on its left-hand and right-hand sides, with appropriate recesses in each case for the accommodation of the cooling elements 22 of the switching elements 20. In addition, a capacitor device 31 is bonded with a connection device 30 (represented on the left) and a control device 30 is fitted to an appropriate retaining device 51 (represented on the right). As represented in the lower part of the diagram, the carrier device 10 with the switching elements 20 fitted is then applied to the retaining device 52 and the connection device 30 with the capacitor device 30 fitted is also bonded with the carrier device 10. Finally, switching elements 20 are electrically bonded with the control device 40 on one side, and electrically bonded with the connection device 30 on the other side.

In summary, the present invention relates to a three-dimensional arrangement for a power converter device, such as an inverter or a rectifier for example. For this purpose, the requisite switching elements, control electronics and load connections are arranged on a carrier device such that exceptionally short conduction paths are achieved. In some embodiments, all the requisite components, such as switching elements, control electronics and load connections, are arranged on a common carrier device. Said carrier device is simultaneously used as a cooling device for the entire switching device. An exceptionally efficient operation of the power converter device is achieved accordingly.

What is claimed is:

1. A power converter arrangement comprising: a three-dimensional carrier arrangement having a trapezoidal cross section with four sides; a plurality of switching elements arranged on a non-parallel pair of opposing sides of the carrier arrangement; a cooling element arranged along with the plurality of switching elements on the two non-parallel pair of opposing sides of the carrier arrangement; a control device that controls the plurality of switching elements, the control device arranged on a longer of the two parallel sides of the carrier arrangement connecting the non-parallel pair of opposing sides of the carrier arrangement.

2. The power converter arrangement of claim 1, wherein each of the plurality of switching elements comprises at least one of a semiconductor switch and a diode.

3. The power converter arrangement of claim 1, wherein the plurality of switching elements are arranged on an exterior surface of the non-parallel pair of opposing sides.

4. The power converter arrangement of claim 1, wherein the carrier arrangement has a hollow interior.

5. The power converter arrangement of claim 4, wherein a coolant fluid flows through the hollow interior of the carrier arrangement.

6. The power converter arrangement of claim 1, wherein:
   the switching elements are arranged on an upper surface of at least one substrate, and
   a lower surface of each substrate, opposite said upper surface of the respective substrate, is arranged on a respective cooling element.

7. The power converter arrangement of claim 1, further comprising a connection device configured to provide at least one of D.C. voltage connections and A.C. voltage connections,
   wherein the connection device is arranged on a side of the carrier arrangement that connects the pair of opposing sides of the carrier arrangement with the plurality of switching elements.

8. The power converter arrangement of claim 7, further comprising a capacitor arrangement connected to the connection device.

9. The power converter arrangement of claim 8, further comprising: the connection device configured to provide the at least one of D.C. voltage connections and A.C. voltage connections; and the capacitor arrangement connected to the connection device; wherein the plurality of switching elements are bonded to at least one of the control device and the connection device by spring contacts.

10. A method for the production of a power converter arrangement, the method comprising: providing a three-dimensional carrier arrangement having a trapezoidal cross section; arranging a plurality of switching elements on a pair of non-parallel opposing sides of the carrier arrangement; arranging a cooling element along with the plurality of switching elements on the two non-parallel pair of opposing sides of the carrier arrangement; and controlling the plurality of switching elements with a control device arranged on a longer of the two parallel sides of the carrier arrangement connecting the pair of non-parallel opposing sides of the carrier arrangement with the plurality of switching elements.

11. The method of claim 10, further comprising flowing a coolant fluid flows through a hollow interior of the carrier arrangement.

12. A power converter arrangement comprising: a three-dimensional carrier arrangement having a hollow interior and a trapezoidal cross section; a plurality of switching elements arranged on first and second sides of the carrier arrangement that face outwardly and away from each other, wherein each switching element includes at least one of a semiconductor switch and a diode; a cooling element arranged along with the plurality of switching elements on the two non-parallel pair of opposing sides of the carrier arrangement; and a control device that controls the plurality of switching elements, the control device arranged at a longer of the two parallel sides of the carrier arrangement.

13. The power converter arrangement of claim 12, wherein a coolant fluid flows through the trapezoidal hollow interior of the carrier arrangement.

14. The power converter arrangement of claim 12, wherein:
the switching elements are arranged on an upper surface of at least one substrate, and
a lower surface of each substrate, opposite said upper surface of the respective substrate, is arranged on a respective cooling element.

15. The power converter arrangement of claim 12, further comprising a connection device arranged on a side of the carrier arrangement and connecting the pair of opposing sides of the carrier arrangement with the plurality of switching elements.

16. The power converter arrangement of claim 12, wherein the plurality of switching elements is bonded to at least one of the control device and the connection device by spring contacts.

* * * * *